(12) United States Patent
Bert et al.

(10) Patent No.: US 10,043,687 B2
(45) Date of Patent: Aug. 7, 2018

(54) BUMPED ELECTRODE ARRAYS FOR MICROASSEMBLERS

(71) Applicant: Palo Alto Research Center Incorporated, Palo Alto, CA (US)

(72) Inventors: Julie A. Bert, East Palo Alto, CA (US); David K. Biegelsen, Portola Valley, CA (US); Sourobh Raychaudhuri, Mountain View, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 15/391,140

(22) Filed: Dec. 27, 2016

(65) Prior Publication Data

US 2018/0182650 A1    Jun. 28, 2018

(51) Int. Cl.

| | |
|---|---|
| *H01L 21/67* | (2006.01) |
| *H01L 25/065* | (2006.01) |
| *H01L 21/68* | (2006.01) |
| *H01L 21/683* | (2006.01) |
| *H01L 21/687* | (2006.01) |
| *H01L 25/00* | (2006.01) |
| *H01L 23/00* | (2006.01) |
| *B81C 99/00* | (2010.01) |
| *B81C 3/00* | (2006.01) |

(52) U.S. Cl.
CPC ........ *H01L 21/67121* (2013.01); *B81C 3/004* (2013.01); *B81C 99/002* (2013.01); *H01L 21/68* (2013.01); *H01L 21/6835* (2013.01); *H01L 21/6875* (2013.01); *H01L 24/95* (2013.01); *H01L 25/0655* (2013.01); *H01L 25/50* (2013.01); *H01L 2221/68368* (2013.01); *H01L 2224/95085* (2013.01); *H01L 2224/95133* (2013.01)

(58) Field of Classification Search
CPC ............... H01L 21/67121; H01L 21/68; H01L 21/6835; H01L 21/6875; H01L 2224/95133; H01L 2224/95085; H01L 2224/95144; H01L 2224/81136; H01L 2224/81129; H01L 24/95; H01L 25/50; H01L 25/95; H01L 25/0655; B81C 99/02; B81C 3/004

See application file for complete search history.

(56) References Cited

U.S. PATENT DOCUMENTS

| | | | |
|---|---|---|---|
| 5,355,577 A * | 10/1994 | Cohn ...................... | B82Y 30/00 29/592.1 |
| 7,332,361 B2 | 2/2008 | Lu et al. | |
| 8,082,660 B2 * | 12/2011 | Lu ..................... | H01L 21/67271 29/739 |

(Continued)

*Primary Examiner* — Michael Trinh
(74) *Attorney, Agent, or Firm* — Womble Bond Dickinson (US) LLP; Daniel Ovanezian (57) ABSTRACT

An apparatus including a bumped electrode array and a method of fabricating a bumped electrode array is disclosed. The method includes providing a substrate for the electrode array. The method also includes disposing a plurality of non-planar structures including electrodes above the substrate of the electrode array. The method further includes disposing a dielectric layer above the plurality of non-planar structures having a defined radius of curvature.

9 Claims, 7 Drawing Sheets

(56) References Cited

U.S. PATENT DOCUMENTS

| | | | |
|---|---|---|---|
| 8,312,619 B2* | 11/2012 | Chow | B81C 99/002 |
| | | | 29/729 |
| 8,646,173 B2* | 2/2014 | Nakagawa | H01L 21/67144 |
| | | | 29/831 |
| 2006/0057293 A1* | 3/2006 | Sharma | H01L 24/86 |
| | | | 427/372.2 |

* cited by examiner

BUMPED ELECTRODE ARRAYS FOR MICROASSEMBLERS

STATEMENT REGARDING FEDERALLY SPONSORED RESEARCH AND DEVELOPMENT

This invention was made with Government support under contract FA8650-15-C-7544 awarded by the Defense Advanced Research Projects Agency. The Government has certain rights in this invention.

BACKGROUND

Microassembly is a method of fabricating semiconductor devices using xerographic and microassembly techniques. Mobile particles may be immersed in an assembly medium that surrounds an electrode array. A charge may be applied to the electrode array that attracts the mobile particles. The charge may attract or repel the mobile particles, which may guide the mobile particles into a desired position and orientation above the electrode array.

BRIEF DESCRIPTION OF THE DRAWINGS

The present disclosure described herein is illustrated by way of example and not by way of limitation in the accompanying figures. For simplicity and clarity of illustration, features illustrated in the figures are not necessarily drawn to scale. For example, the dimensions of some features may be exaggerated relative to other features for clarity. Further, where considered appropriate, reference labels have been repeated among the figures to indicate corresponding or analogous elements.

DETAILED DESCRIPTION

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Demand for semiconductor devices having high densities of surface mounted components continues to increase. For example, a semiconductor device may contain hundreds or thousands of surface mounted components that must be placed on a substrate in the proper position with the correct orientation. One method of placing these surface mounted components is known as microassembly. In microassembly, a plurality of mobile particles (e.g., chiplets) may be immersed in an assembly medium (e.g., a dielectric fluid). An electrode array may be submerged in a container having the assembly medium containing the mobile particles. The electrode array may generate a field to position and orient the mobile particles in locations above the electrode array. The position may refer to a point or place relative the electrode array. The orientation may be the rotation of the mobile particle relative to the electrode array. The mobile particles may be moved, via the field, above the surface of the electrode array until each of the mobile particles is positioned and oriented at a location above the electrode array. Once the mobile particles are in the desired locations, the electrode array may be used to transport the mobile particles, where they may be transferred to a final substrate. Challenges of microassembly may include interference of the edges of the mobile particles with topographical features of the electrode array, a high effective static friction and squeeze film impedance as the mobile particles move above the surface of the electrode array, which may prevent the mobile particles from moving above the surface of the electrode array. The static friction may refer to forces resisting the relative motion of solid surfaces, fluid layers and material elements sliding against one another. Furthermore, for a mobile particle moving along a planar surface the fluid layer between the particle and the surface can become small making subsequent movement of the mobile particle problematic. Squeeze film impedance may be impedance on a freely moving structure that is separated from a stationary structure by a thin layer of fluid. As the freely moving structure moves, flow occurs in the thin layer of fluid and the resulting energy dissipation produces impedance. This impedance increases as the inverse of the fluid film thickness (t) cubed ($1/t^3$) making the impedance of thin fluid films substantially higher than thick fluid films.

The present disclosure addresses the above-mentioned and other deficiencies by providing for an electrode array having curved surfaces that reduce contact area with the mobile particle, which may reduce the interference of topographical features, static friction and squeeze film impedance. The present disclosure may reduce the interference of topographical features by rounding the features and reducing the contact angle between the array and mobile particle. The present disclosure may reduce the static friction by reducing the contact area between the mobile particle and the array surface. The present disclosure may reduce squeeze film impedance by allowing a thicker film of the assembly fluid to flow under the mobile particle in the area between the curved surfaces and the mobile particle. The present disclosure may include an electrode array with curved surfaces having a defined pitch, height, and defined radius of curvature that help prevent translational forces from flipping the mobile particles. In implementations, the electrode assembly includes a substrate having one or more non-planar structures that conduct a field to control the movement of the mobile particle to predefined positions and orientations respective to the electrode array.

Figure 1:
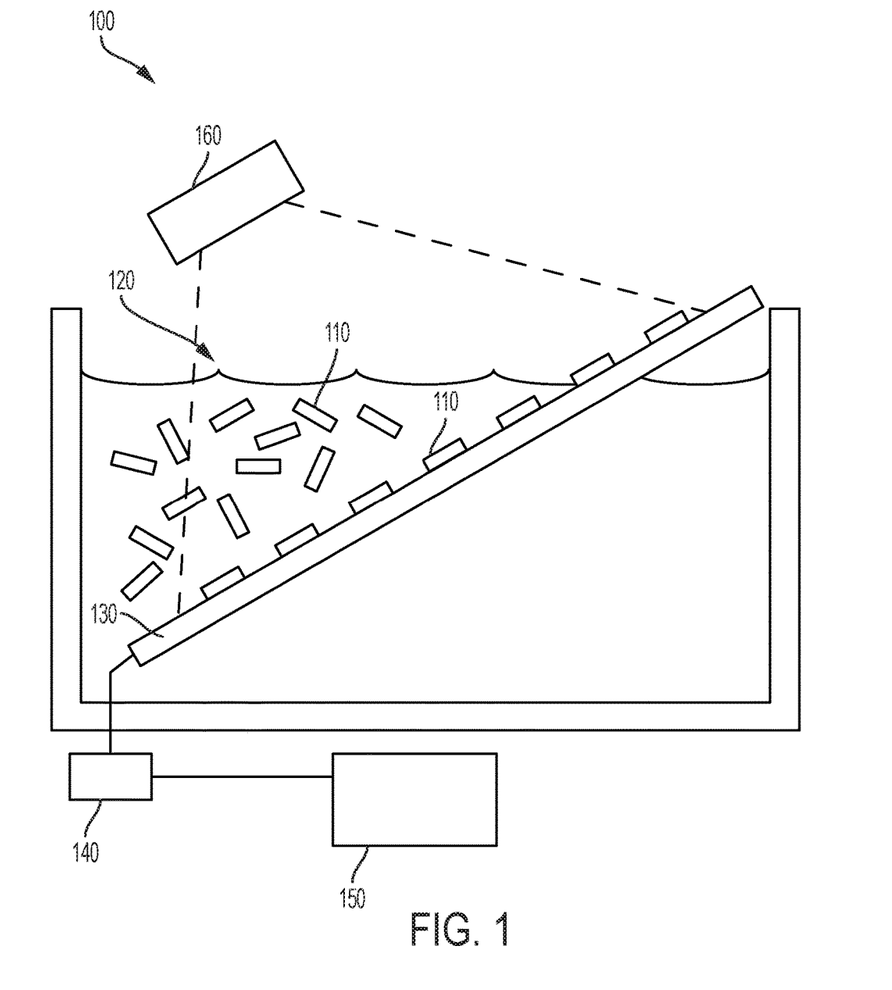
FIG. 1 illustrates a microassembly system in accordance with embodiments of the present disclosure.

FIG. 1 is a cross-sectional view of a microassembly unit 100 for use with implementations of the present disclosure. The microassembly unit 100 includes a container that holds an assembly medium 120. In some implementations, the assembly medium 120 may be a dielectric fluid. In other implementations, the assembly medium 120 may be a gas, such as nitrogen. The mobile particles 110 may be immersed in the assembly medium 120 as illustrated in FIG. 1. The mobile particle 110 may be any particle that has at least one substantially planar surface. The substantially planar surface may be a surface of the mobile particle having a local roughness (e.g., height of a feature on the substantially planar surface) that is less than 10% of the length of the particle. In some implementations, the mobile particle 110 may have an electrical charge that allows the mobile particle 110 to be attracted or repelled by a field (e.g., electric field or magnetic field) emitted by an electrode array 130. In another implementation, the mobile particle 110 may not have an electrical charge and may be moved above the surface of the electrode array 130 using induced dipole forces. The electrode array 130 (also referred to as an "array" or "bumped electrode array" herein) may include a substrate having non-planar structures. The electrode array 130 may be submerged into the assembly medium 120. The electrode array 130 of FIG. 1 is illustrated as planar, but may include curved surfaces as described herein. The curved surfaces may reduce interference with topographical features by rounding the features and reducing the contact angle between the array and mobile particle. The curved surfaces may reduce friction between the electrode array 130 and the mobile particles 110 by reducing the amount of surface area where the mobile particles 110 are in contact with the surface of the electrode array 130. The curved surfaces may reduce squeeze film impedance by providing volume for the assembly fluid to flow underneath the mobile particles 110 and increasing the squeeze film thickness. In one implementation, the surface of electrode array 130 may have planar portions located in between each of the curved surfaces. In another implementation, the surface of electrode array 130 may not have planar portions located in between each of the curved surfaces.

In one implementation, the non-planar structures may be disposed onto a surface of a planar substrate. In one implementation, the substrate may have embedded electronic components. In another implementation, the substrate may have electronics placed on a surface opposite the non-planar structures and connected to the non-planar structures through vias. In yet another implementation, the substrate may be a non-planar substrate where the electrodes may be disposed above the non-planar features of the substrate. In a further implementation, a planar substrate may be etched to form non-planar features on a surface of the substrate. In still another implementation, a planar substrate may be used to create curved surfaces above the planar substrate.

In one implementation, the electrode array 130 may be coupled to a controller 140. The controller 140 may determine which of the non-planar structures are energized in order to generate a desired field for the attracting, positioning and orienting of the mobile particles 110 at a position above the electrode array 130. The controller 140 may be coupled to a power source 150. The power source 150 may provide power or field to the electrode array 130 having non-planar structures using the controller 140 in order to generate the field. In one implementation, the generated field may be an electric field produced by stationary or oscillating charges of the electrode array 130. In another implementation, the generated field may be a magnetic field produced by moving charges (i.e., current) of the electrode array 130. In a further implementation, the generated field may be an electromagnetic field that includes both the electric field and magnetic field components of the electrode array 130.

In another implementation, the electrode array 130 may be coupled directly to power source 150. The electrode array 130 may include a plurality of phototransistors, which may become energized in response to exposure to light. A surface of the electrode array 130 may be exposed to light from an optical projector 160, where the optical projector projects an image corresponding to the desired position and orientation of the mobile particles 110. The phototransistors illuminated by the image may generate a field to attract, position and orient the mobile particles 110 to a location above the electrode array 130. The phototransistors that are not illuminated by the projected image may not generate a field. For illustration purposes, optical projector 160 is shown above the electrode array 130 and projecting an image onto the top surface of the electrode array 130. However, in another implementation, the optical projector 160 may be located below the electrode array 130 and project the image onto the bottom surface of the electrode array 130.

Figure 2:
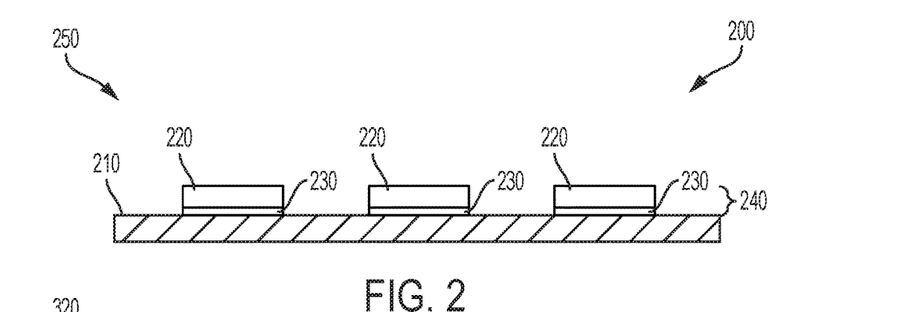
FIG. 2 illustrates a fabrication process for an electrode array, according to an implementation.
Figure 3:
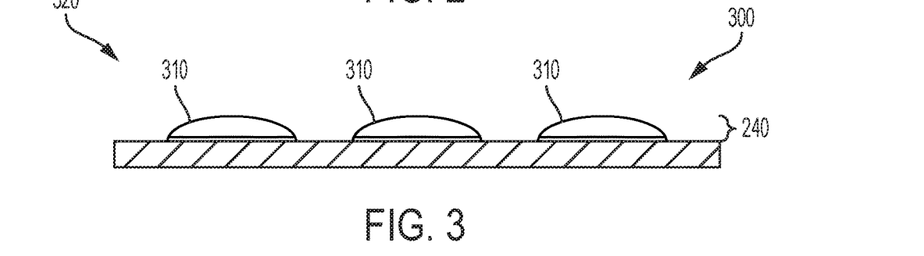
FIG. 3 illustrates a fabrication process for an electrode array, according to an implementation.
Figure 4:
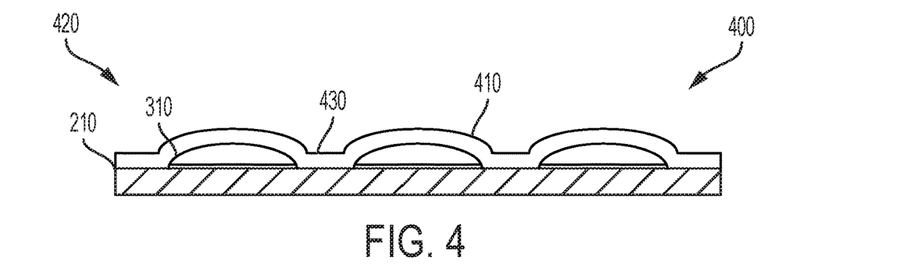
FIG. 4 illustrates a fabrication process for an electrode array, according to an implementation.

FIGS. 2-4 illustrate a fabrication process for an electrode array, according to an implementation. The fabrication process includes electrode array 130 at various processes of the fabrication process (e.g. electrode array 250, 320, and 420 of FIGS. 2-4, respectively), according to one exemplary implementation. It may be noted that the fabrication process illustrated in FIGS. 2-4 is shown for purposes of illustration, rather than limitation. The fabrication process may be performed in any order, include any number of processes, and include more, the same, or fewer processes. It may also be noted that for purposes of illustration, rather than limitation, materials are described in the various layers of the fabrication process. Other materials, other or in addition to the materials described with respect to FIGS. 2-4, may also be used in other implementations.

FIG. 2 is an illustration of an electrode array 250 of the fabrication process 200 including a substrate 210, electrodes 230 and reflow material 220. Substrate 210 may be a variety of materials, including, but not limited to, silicon, glass or plastic. The electrodes 230 may be disposed on a surface of the substrate 210. It may be noted that substrate 210 is a planar substrate in implementations. It may also be noted that electrodes 230 may be planar electrodes (or curved electrodes) where reflow operations on reflow material 220 may form the non-planar feature of the non-planar structures 240. The non-planar structure 240 is the structure composed of both the electrode 230 and the reflow material 220. It may be noted that in implementations, electrodes (planar or non-planar) 230 alone or electrodes 230 and reflow material 220 that form the non-planar structure 240 may be considered an electrode. The electrodes 230 may be any conductive material. Examples of conductive material include, but are not limited to, copper, gold, silver, indium tin oxide (ITO) film or composite materials. The electrodes 230 or non-planar structures 240 may be disposed on the surface of the substrate 210 using a photolithography process that uses light to transfer a pattern to the wafer. The photolithography process may include an etching process to remove one or more layers (or parts of one or more layers) from the surface of substrate 210. The etching process may include dry etch or wet etch. In one implementation, the non-planar structures 240 may be arranged in an array that corresponds to the parameters discussed below with respect to FIGS. 10-12. In another implementation, the non-planar structures 240 may be arranged in a staggered pattern, where the centers of the non-planar structures 240 in a row and/or column are not aligned with the centers of the non-planar structures 240 in adjacent rows and/or columns. The reflow material 220 may be disposed above the electrodes 230 to form pillars as one implementation of the non-planar structure 240. The reflow material 220 may be any material capable of reflow. Examples of materials capable of reflow may include, but are not limited to, indium, solder, glass, plastic, ceramic or composite materials. In one implementation, the reflow material 220 may be initially disposed above the electrodes 230 to form angular features.

FIG. 3 illustrates an electrode array 320 of the fabrication process 300 subsequent to a reflow operation being performed on the electrode array 250 of FIG. 2. In one implementation, the reflow operation may be performed by subjecting the substrate 210, the electrodes 230 and the reflow material 220 to controlled heat that melts reflow material 220 into the desired shape. In another implementation, the reflow operation may be performed using ultrasonic soldering, where the reflow material 220 is exposed to high frequency acoustic waves. The reflow material 220 may be reflowed, resulting in curved surfaces 310 that satisfy the parameters discussed at FIGS. 10-12. The parameters for the reflow process (e.g., time, temperature, etc.) may be dependent on the reflow material 220.

In FIG. 4, electrode array 420 illustrates the fabrication process 400 of a dielectric layer 410 being disposed above the substrate 210 and curved surfaces 310 of FIGS. 2 and 3. In an implementation, dielectric layer may be applied as a conformal coating. In some implementations, the height of the curved surfaces of the electrode array 420 may be changed without changing the radius of curvature before the application of the dielectric layer by for example, spinning a high viscosity polymer or depositing a conformal coating and then etching the non-planar portions above the curved surfaces 310. It may be noted that spinning a high viscosity polymer, the dielectric material may effectively pool in the planar portions 430 rather than on the curved surfaces 310. In implementations, the dielectric layer 410 may be disposed above the substrate 210, the non-planar structures 240 and the curved surfaces 310 and may conform to the surface topology of the features located below the dielectric layer 410 (to create the curved surfaces of the dielectric layer 410). In implementations, the dielectric layer 410 may be disposed by sputtering or any other method capable of achieving conformal coverage of the substrate 210, the non-planar structures 240 and the curved surfaces 310. This may result in an electrode array 420 with a surface having dimensions that satisfy the parameters discussed at FIGS. 10-12. In one implementation, the surface of electrode array 420 may have planar portions 430 located in between each of the curved surfaces 310. In some implementations, the dielectric layer may not be applied as a conformal coating. For example, a high viscosity polymer or coating may be disposed onto the planar portions 430 of the electrode array 420 without being disposed on the underlying curved surfaces (or minimally disposed on the underlying curved surfaces). In another example, the dielectric layer may be removed from the curved surfaces 310 by etching or another similar process. In another implementation, the surface of electrode array 420 may not have planar portions located in between each of the curved surfaces 310.

Figure 5:
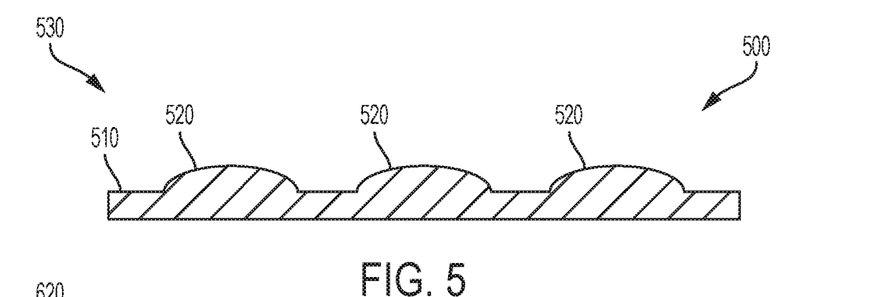
FIG. 5 illustrates a fabrication process for an electrode array, according to another implementation.
Figure 6:
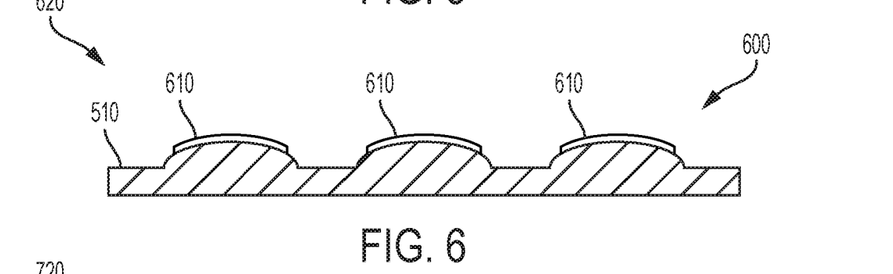
FIG. 6 illustrates a fabrication process for an electrode array, according to another implementation.
Figure 7:
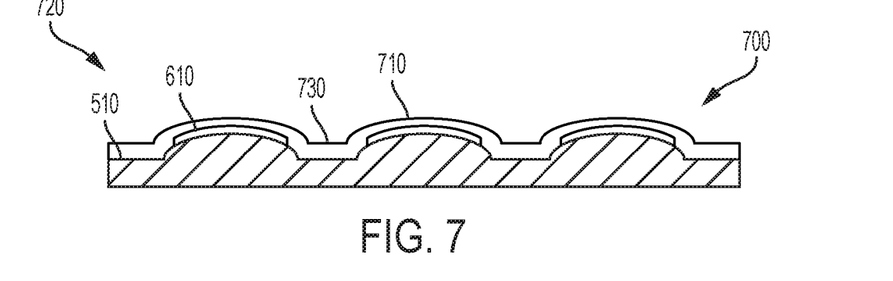
FIG. 7 illustrates a fabrication process for an electrode array, according to another implementation.

FIGS. 5-7 illustrate a fabrication process for an electrode array, according to an implementation. The fabrication process includes electrode array 130 at various processes of the fabrication process (e.g. electrode array 530, 620 and 720 of FIGS. 5-7, respectively), according to one exemplary implementation. It may be noted that the fabrication process illustrated in FIGS. 5-7 is shown for purposes of illustration, rather than limitation. The fabrication process may be performed in any order, include any number of processes, and include more, the same, or fewer processes. It may also be noted that for purposes of illustration, rather than limitation, materials are described in the various layers of the fabrication process. Other materials, other or in addition to the materials described in FIGS. 5-7, may also be used in other implementations.

FIG. 5 is an illustration of an electrode array 530 at a stage of the fabrication process 500 including a substrate 510. The substrate 510 may include curved surfaces 520. In one implementation, the substrate 510 and the curved surfaces 520 may be fabricated by a molding process in which a molding material is shaped using a rigid frame. Examples of molding materials include, but are not limited to, glass, plastic, epoxy resin or the like. In another implementation, the substrate 510 may be a planar substrate and the curved surfaces 520 may be formed by an etching process. In yet another implementation, the substrate 510 may be a planar substrate including a light-sensitive material that becomes cross-linked when exposed to ultraviolet rays and non cross-linked material is washed away to form the curved surfaces 520. In a further implementation, the substrate 510 may be a planar substrate and the curved surfaces 520 may be formed by depositing subsequent layers of material. In one implementation, the curved surfaces 520 may be arranged to correspond to the parameters that will be discussed in more detail at FIGS. 10-12. In another implementation, the curved surfaces 520 may be arranged in a staggered pattern.

FIG. 6 illustrates the fabrication process 600 of non-planar structures 610 being disposed on the curved surfaces 520 of an electrode array 620. The non-planar structures 610 (e.g., electrodes) may be any conductive material. Examples of conductive material include, but are not limited to, copper, gold, silver, ITO film or composite materials. The non-planar structures 610 may be disposed on top of the curved surfaces 520 of the electrode array 620 and may follow the surface topology of the curved surfaces 520. The non-planar structures 610 may be disposed above the curved surfaces 520 using a photolithography process that uses light to transfer a pattern to the wafer. The photolithography process may include an etching process or liftoff process to remove one or more layers (or parts of one or more layers) from the surface of electrode array 620. The etching process may include dry etch or wet etch. In one implementation, the non-planar structures 610 may be disposed directly above the top surface of the curved surfaces 520.

In FIG. 7, electrode array 720 illustrates the fabrication process 700 of a dielectric layer 710 being disposed above the substrate 510, the curved surfaces 520 and the non-planar structures 610 of FIGS. 5 and 6. In an implementation, dielectric layer may be applied as a conformal coating. In some implementations, the height of the curved surfaces of the non-planar structures 610 may be changed without changing the radius of curvature before the application of the dielectric layer by for example, spinning a high viscosity polymer or depositing a conformal coating and then etching the non-planar portions above the non-planar structures 610. The dielectric layer 710 may be disposed above the substrate 510, the non-planar structures 610 and the curved surfaces 520 and may conform to the surface topology of the features located below the dielectric layer 710. In implementations, the dielectric layer 710 may be disposed above the substrate 510, the curved surfaces 520 and the non-planar structures 610 and may conform to the surface topology of the features located below the dielectric layer 710 (to create the curved surfaces of the dielectric layer 710). This may result in an electrode array 720 with a surface having dimensions that satisfy the parameters discussed at FIGS. 10-12. In one implementation, the surface of electrode array 720 may have planar portions 730 located in between each of the curved surfaces 520. In some implementations, the dielectric layer may not be applied as a conformal coating. For example, a high viscosity polymer or coating may be disposed onto the planar portions 730 of the electrode array 720 without being disposed on the underlying curved surfaces (or minimally disposed on the underlying curved surfaces). In another example, the dielectric layer may be removed from the curved surfaces 520 by etching or another similar process. In another implementation, the surface of electrode array 720 may not have planar portions located in between each of the curved surfaces 520.

Figure 8:
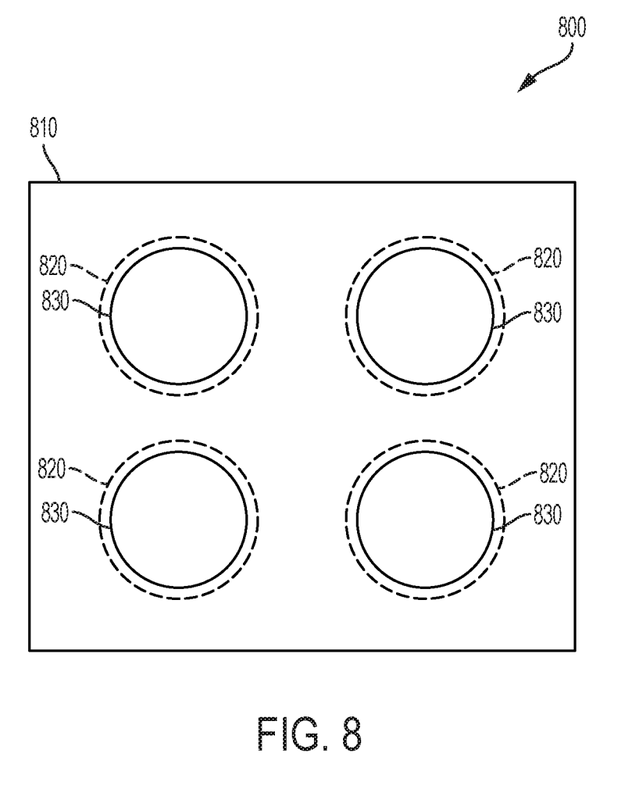
FIG. 8 illustrates a top-down view of the electrode array, according to implementations.

FIG. 8 is a top-down illustration 800 of a portion of an electrode array 810 according to implementations of the present disclosure. The electrode array 810 may correspond to electrode arrays 420 or 720 of FIGS. 4 and 7, respectively. A surface of the electrode array 810 may include curved surfaces 820. The curved surfaces 820 may correspond to curved surfaces 310 or 520 of FIGS. 3 and 5, respectively. In one implementation, the curved surfaces 820 may be arranged in an array of equally spaced rows and columns that satisfy the parameters described in FIGS. 10-12. In another implementation, the curved surfaces 820 may be arranged in a staggered pattern (not shown).

The non-planar structures 830 may correspond to non-planar structures 240 or 610 of FIGS. 2 and 6, respectively. The non-planar structures 830 may be located above the curved surfaces 820 with the center of the non-planar structures 830 aligning with the center of the curved surfaces 820.

Figure 9:
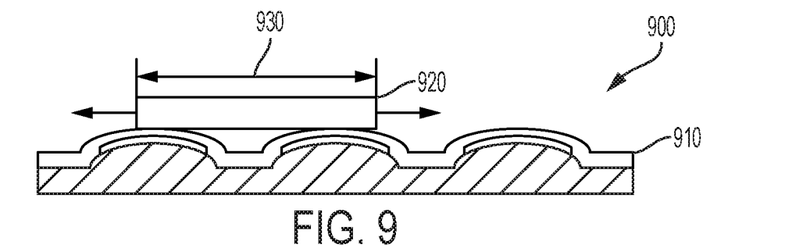
FIG. 9 illustrates a mobile particle moving along the surface of the electrode array, according to implementations.

FIG. 9 is an illustration 900 of a mobile particle 920 moving above the surface of the electrode array 910, according to implementations. The electrode array 910 may correspond to electrode arrays 420 or 720 of FIGS. 4 and 7, respectively. As previously described, the non-planar structures of the electrode array 910 may generate a field that may attract or repel mobile particle 920. The mobile particle 920 may have a length 930 and may include at least one substantially planar surface. The field may attract mobile particle 920 to the top surface of the electrode array 910. The field may then push or pull the mobile particle 920 laterally above the top surface of the electrode array 910 to move the mobile particle 920 to a desired location above the electrode array 910. The field may rotate the mobile particle 920 to manipulate the mobile particle 920 into a desired orientation above the electrode array 910.

Figure 10:
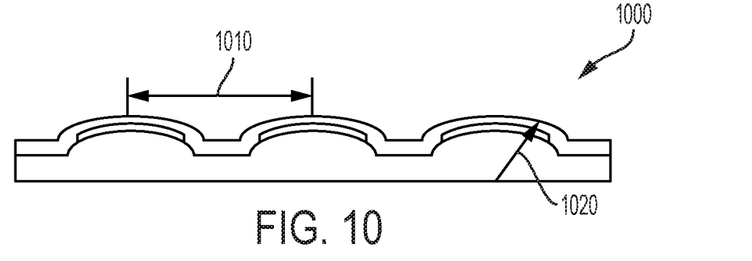
FIG. 10 illustrates parameters of the electrode array, according to implementations.
Figure 11:
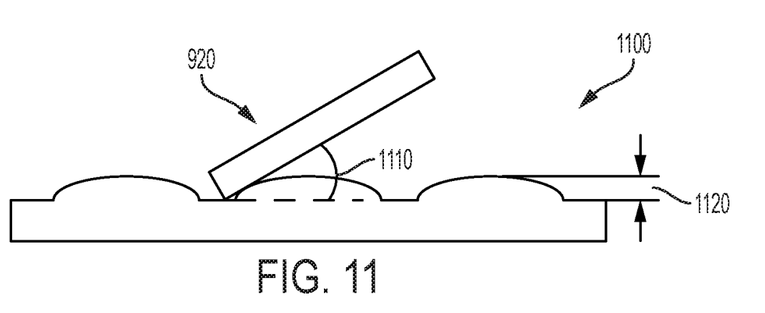
FIG. 11 illustrates parameters of the electrode array, according to implementations.

FIGS. 10 and 11 illustrate parameters of electrode arrays 1000 and 1100, according to implementations. The parameters may include the pitch 1010, defined radius of curvature 1020, tilt angle 1110 and height 1120. In FIG. 10, the electrode array 1000 may represent electrode arrays 420 or 720 of FIGS. 4 and 7, respectively. The pitch 1010 of the electrode array 1000 may be the distance between the center of one curved surface to the center of an adjacent curved surface. In one implementation, the pitch 1010 may be greater than or equal to 1 micron. The defined radius of curvature 1020 of the curved surface may be the radius of a circular arc that approximates the curve of the curved surfaces of the electrode array 1000. In one implementation, the defined radius of curvature 1020 of the curved surfaces may be constant resulting in the curved surfaces having a circular geometry. In another implementation, the defined radius of curvature 1020 of the curved surfaces may vary resulting in the curved surfaces having an elliptical geometry. In implementations, the defined radius of curvature 1020 may be for all or part of a curved surface. In implementations, the defined radius of curvature 1020 may be constant (e.g., for circular shapes) or varying (e.g., for elliptical shapes). In implementations, the parameters of electrode arrays 1000 and 1100 may be dependent on the length 930 of the mobile particle 920. For example, the pitch 1010 may be less than or equal to the length 930 of the mobile particle 920. The pitch 1010 may be used to determine the height 1120 and the defined radius of curvature 1020 using the equations described below.

FIG. 11 illustrates the height 1120 and tilt angle 1110 of the electrode array 1100. The electrode array 1100 may represent electrode arrays 420 or 720 of FIGS. 4 and 7, respectively. The tilt angle 1110 may correspond to the angle between the surface of array 1100 and the bottom surface of the mobile particle 920. The tilt angle 1110 may be low enough to prevent mechanical interference with the translation of the mobile particle 920. Additionally, the tilt angle 1110 may be low enough to prevent forces, such as translation forces, from flipping or tumbling the mobile particle 920 (and rendering the mobile particle 920 unusable) as it moves above the surface of electrode array 1100. For example, in one implementation the tilt angle may be less than 45 degrees. In another implementation, the tilt angle may be less than 30 degrees. The height 1120 of the curved surfaces may correspond to the vertical distance between the surface of electrode array 1100 and the top of the curved surfaces. In one implementation, the curved surfaces of electrode array 1100 may be the same height. In other implementations, the curved surfaces of electrode array 1100 may have varying heights. In one implementation, the height 1120 may be greater than 1 micron and less than 5 microns. It may be noted that given a desired tilt angle (e.g., 45 degrees), other dimensions such pitch 110, height 1120, or defined radius of curvature 1020 of the electrode array 1000 may be determined or adjusted to achieve the desired tilt angle 1110, as described below.

In some implementations, one or more parameters of the previously described parameters may be used to generate the dimensions of features of the electrode array 1100. In some implementations, the below equations may be for electrode arrays having planar portions between the curved features. An example of an electrode array 1100 is described as follows:

For a structure with planar regions between the non-planar structures the defined radius of curvature 1020, the pitch 1010, and the height 1120 may define the maximum tilt angle 1110:

$$\alpha = a\cos\left(\frac{r-h}{r}\right) + \frac{\pi}{2} - a\sin\left(\frac{r-h}{\sqrt{p^2 + r^2 - 2p\sqrt{2rh - h^2}}}\right) -$$

$$asin\left(\frac{\sqrt{p^2 - 2p\sqrt{2rh - h^2}}}{\sqrt{p^2 + r^2 - 2p\sqrt{2rh - h^2}}}\right)$$

where α is the tilt angle 1110, r is the defined radius of curvature 1020, p is the pitch 1010 and h is the height 1120. As previously described, it may be desirable for the tilt angle 1110 to be less than 45 degrees. Using the above equation, the defined radius of curvature 1020, height 1120 and pitch 1010 may be determined so that the tilt angle 1110 does not exceed a particular number of degrees, such as 45 degrees.

Figure 12:
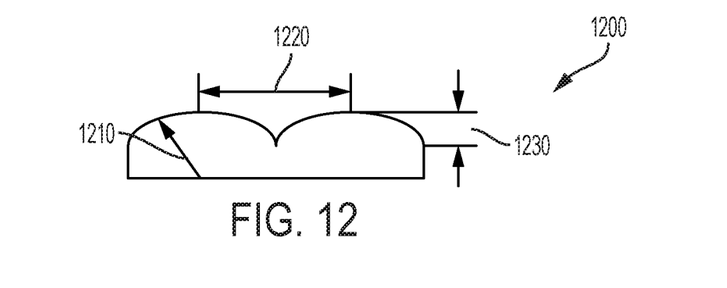
FIG. 12 illustrates parameters of the electrode array, according to implementations.

FIG. 12 illustrates parameters of electrode array 1200, according to another implementation. In FIG. 12, the electrode array 1200 may not have planar portions in between curved surfaces. The parameters may include defined radius of curvature 1210, and pitch 1220. Height 1230 may be defined by the intersection between two adjacent non-planar structures and is not an independent variable. The defined radius of curvature 1210 of the curved surfaces may be the radius of a circular arc that approximates the curve of the curved surfaces of the electrode array 1200. In one implementation, the defined radius of curvature 1210 of the curved surfaces may be constant resulting in the curved surfaces having a circular geometry. In another implementation, the defined radius of curvature 1210 of the curved surfaces may vary resulting in the curved surfaces having an elliptical geometry. The pitch 1220 of the electrode array may be the distance between the center of one curved surface to the center of an adjacent curved surface.

One or more parameters of the previously described parameters may be used to generate the dimensions of the electrode array 1200. An example of an electrode array 1200 is described as follows:

For an electrode array without planar features between the non-planar structures the defined radius of curvature 1020, and the pitch 1010 may define the maximum tilt angle 1110:

$$\alpha = 2asin\left(\frac{p}{2r}\right)$$

where α is the tilt angle 1110, r is the defined radius of curvature 1020, and p is the pitch 1010. Using the above equation, the defined radius of curvature 1020, and pitch 1010 may be determined so that the tilt angle 1110 does not exceed a particular number of degrees, such as 45 degrees.

Figure 13:
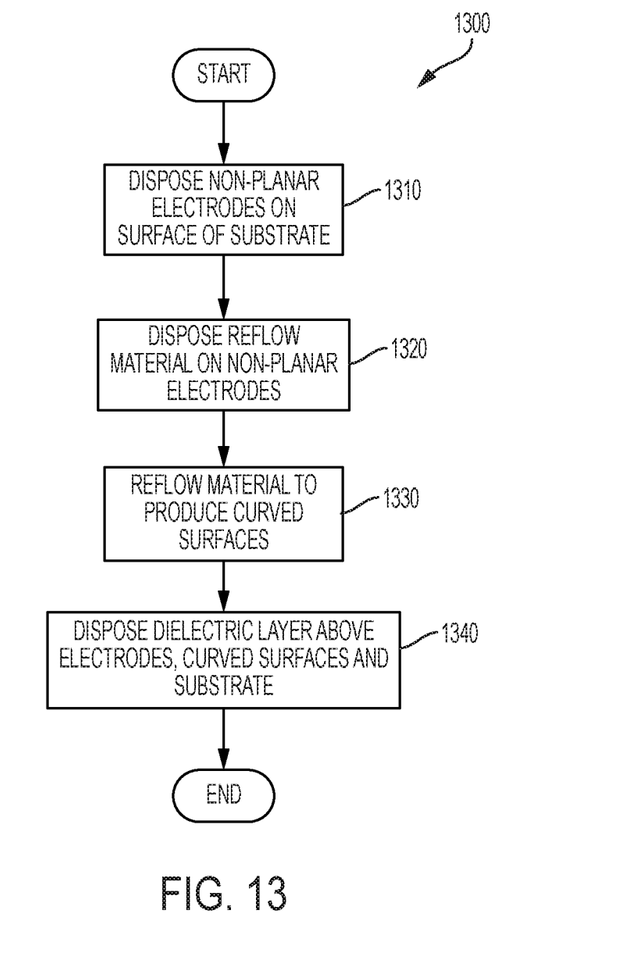
FIG. 13 illustrates a process flow for fabricating an electrode array, according to an implementation.

FIG. 13 illustrates a process flow 1300 for fabricating an electrode array, according to one implementation. Blocks 1310 and 1320 may be representative of the illustration shown in FIG. 2. At block 1310, electrodes 230 may be disposed onto a surface of a substrate 210. The electrodes 230 may be disposed on the surface of the substrate 210 using a photolithography process that uses light to transfer a pattern to the wafer. The photolithography process may include an etching process to remove one or more layers (or parts of one or more layers) from the surface of substrate 210. The etching process may include dry etch or wet etch. At block 1320, a reflow material 220 may be disposed above the electrodes 230 of block 1310. The reflow material may be any material that is capable of being reflowed, such as indium, solder, glass, plastic, ceramic, composite materials or the like. In implementations, the combined structure formed by the electrode 230 and the reflow material 220 may constitute the non-planar structures 240. In one implementation, the material may be disposed in an array of rows and columns in accordance with the parameters described in FIGS. 10-12. In another implementation, the material may be disposed in a staggered pattern. Block 1330 may be representative of the illustration shown in FIG. 3. At block 1330, a reflow operation may be performed on the reflow material 220 disposed on the electrodes 230 at block 1320. In one implementation, the reflow operation may be performed by subjecting the material to controlled heat that melts the material into a desired shape. In another implementation, the reflow operation may be performed using ultrasonic soldering, where the material is exposed to high frequency acoustic waves. Following the reflow operation, the non-planar structures 240 may have a hemispherical shape (i.e., curved surfaces 310). Block 1340 may be representative of the illustration shown in FIG. 4. At block 1340, a dielectric layer 410 may be disposed above the substrate 210, the non-planar structures 240 and the curved surfaces 310 of blocks 1310-1330. In implementations, the dielectric layer 410 may conform to the surface topology of the features located below the dielectric layer 410 or may be used between the non-planar structures 240 to adjust the height as noted above at least with respect to FIG. 4. In implementations, the dielectric layer may be disposed by sputtering or any other method capable of achieving conformal coverage above or just between of the substrate 210, the non-planar structures 240 and the curved surfaces 310. This may result in an electrode array 420 with a surface having dimensions that satisfy the parameters discussed at FIGS. 10-12.

Figure 14:
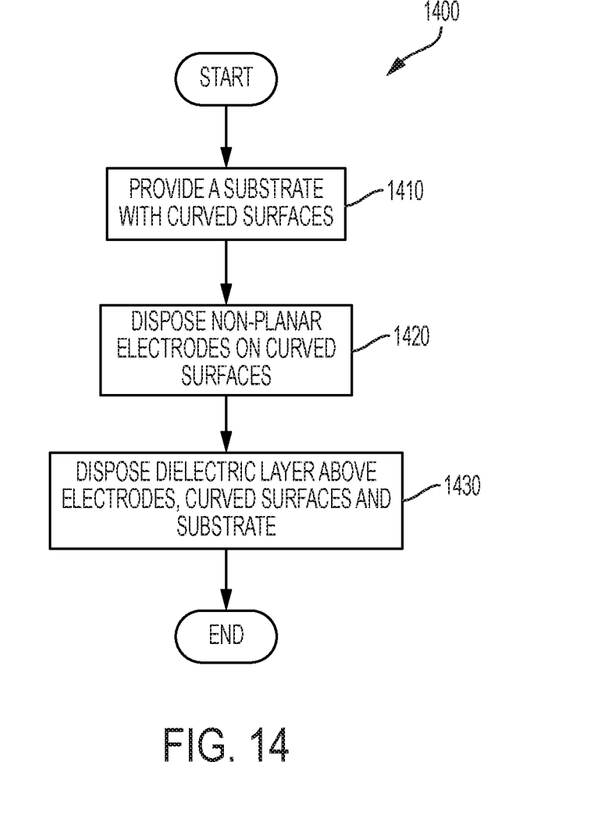
FIG. 14 illustrates a process flow for fabricating an electrode array, according to another implementation.

FIG. 14 illustrates a process flow 1400 for fabricating an electrode array, according to another implementation. Block 1410 may be representative of the illustration shown in FIG. 5. At block 1410, a substrate 510 may be provided including curved surfaces 520. In one implementation, the surface of the electrode array 530 may have planar portions located in between each of the curved surfaces 520. In another implementation, the surface of the electrode array 530 may not have planar portions located in between each of the curved surfaces 520. In one implementation, the curved surfaces 520 may be arranged to correspond to the parameters described in FIGS. 10-12. In another implementation, the curved surfaces 520 may be arranged in a staggered pattern. Block 1420 may be representative of the illustration shown in FIG. 6. At block 1420, non-planar structures 610 may be disposed above the curved surfaces 520 of electrode array 530. The non-planar structures 610 may be disposed on the surface of the substrate 210 using a photolithography process that uses light to transfer a pattern to the wafer. The photolithography process may include an etching process to remove one or more layers (or parts of one or more layers) from the surface of electrode array 620. The etching process may include dry etch or wet etch. Block 1430 may be representative of the illustration shown in FIG. 7. At block 1430, a dielectric layer 710 may be disposed above the substrate 510, and above or between the non-planar structures 610 and the curved surfaces 520 of blocks 1410 and 1420. The dielectric layer 710 may conform to the surface topology of the features located below the dielectric layer 710. The dielectric layer may be disposed by sputtering or any other method capable of achieving conformal coverage of the substrate 510, the non-planar structures 610 and the curved surfaces 520. This may result in an electrode array 720 with a surface having dimensions that satisfy the parameters discussed at FIGS. 10-12.

Various operations are described as multiple discrete operations, in turn, in a manner that is most helpful in understanding the present disclosure, however, the order of description may not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" throughout is not intended to mean the same implementation or implementation unless described as such. The terms "first," "second," "third," "fourth," etc. as used herein are meant as labels to distinguish among different elements and may not necessarily have an ordinal meaning according to their numerical designation.

It will be appreciated that variants of the above-disclosed and other features and functions, or alternatives thereof, may be combined into many other different systems of applications. Various presently unforeseen or unanticipated alternatives, modifications, variations, or improvements therein may be subsequently made by those skilled in the art which are also intended to be encompassed by the following claims.

What is claimed is:

1. A system comprising:
an assembly medium;
a plurality of mobile particles at least partially submersed in the assembly medium; and
an array, at least partially submersed in the assembly medium, the array comprising:
a substrate;
a plurality of non-planar structures comprised of electrodes disposed above the substrate, wherein the plurality of non-planar structures comprise a plurality of first curved surfaces, wherein the plurality of non-planar structures disposed above the substrate are to manipulate each of the plurality of mobile particles into a predetermined position and orientation; and
a dielectric layer disposed above and between the plurality of non-planar structures, wherein the dielectric layer conforms to the plurality of first curved surfaces of the plurality of non-planar structures to form a plurality of second curved surfaces of the dielectric layer, wherein the plurality of second curved surfaces of the dielectric layer facilitates the movement of each of the plurality of mobile particles through the assembly medium to the predetermined position and orientation and have a defined radius of curvature.

2. The system of claim 1, further comprising:
a power source operatively coupled to the array to provide power to the plurality of non-planar structures comprising electrodes and to provide a field to facilitate the movement of each of the plurality of mobile particles through the assembly medium to the predetermined position and orientation.

3. The system of claim 1, further comprising:
a controller operatively coupled to the power source to control a field conducted through individual electrodes of the plurality of non-planar structures.

4. The system of claim 1, wherein the substrate comprises a plurality of third curved surfaces, wherein the plurality of non-planar structures are disposed above and aligned with the plurality of third curved surfaces of the substrate.

5. The system of claim 1, wherein each of the plurality of non-planar structures comprise an electrode and a reflow metal above the electrode that is reflowed to form a curved surface of the first plurality of curved surfaces.

6. The system of claim 1, wherein the mobile particle is comprised of at least one substantially planar surface.

7. The system of claim 6, wherein the plurality of second curved surfaces has a pitch that is less than or equal to a length of the substantially planar surface of the mobile particle.

8. The system of claim 7, wherein the pitch is greater than or equal to 1 micron.

9. The system of claim 1, wherein the plurality of second curved surfaces have the defined radius of curvature, a pitch, and a height to prevent a tilt angle of the mobile particle from exceeding 45 degrees.

* * * * *